United States Patent
Miyano (10) Patent No.: US 10,770,481 B2
(45) Date of Patent: Sep. 8, 2020

(54) SEMICONDUCTOR DEVICE AND METHOD FOR MANUFACTURING THE SAME

(71) Applicant: NuFlare Technology, Inc., Yokohama-shi, Kanagawa (JP)

(72) Inventor: Kiyotaka Miyano, Tokyo (JP)

(73) Assignee: NuFlare Technology, Inc., Kanagawa (JP)

(*) Notice: Subject to any disclaimer, the term of this patent is extended or adjusted under 35 U.S.C. 154(b) by 0 days.

(21) Appl. No.: 16/123,634

(22) Filed: Sep. 6, 2018

(65) Prior Publication Data
US 2019/0081078 A1   Mar. 14, 2019

(30) Foreign Application Priority Data
Sep. 11, 2017   (JP) ................................. 2017-173834

(51) Int. Cl.
*H01L 27/12*   (2006.01)
*H01L 29/16*   (2006.01)
(Continued)

(52) U.S. Cl.
CPC ...... *H01L 27/1207* (2013.01); *H01L 21/0245* (2013.01); *H01L 21/0254* (2013.01); *H01L 21/0259* (2013.01); *H01L 21/02381* (2013.01); *H01L 21/02433* (2013.01); *H01L 21/02488* (2013.01); *H01L 21/02502* (2013.01);
(Continued)

(58) Field of Classification Search
CPC . H01L 27/1207; H01L 21/76; H01L 21/8258; H01L 21/02529; H01L 29/7786; H01L 27/088; H01L 21/02502; H01L 21/76264; H01L 29/1608; H01L 29/7787; H01L 29/2003; H01L 29/045; H01L 29/0649; H01L 21/0259; H01L 21/0245; H01L 21/02488; H01L 21/02381; H01L 21/02516; H01L 21/02433; H01L 21/0254; H01L 21/02532; H01L 21/02609
See application file for complete search history.

(56) References Cited

U.S. PATENT DOCUMENTS 6,379,985 B1   4/2002   Cervantes et al.
10,453,679 B2 *  10/2019   Dasgupta .......... H01L 21/02516
(Continued)

FOREIGN PATENT DOCUMENTS

JP       2004179242 A    6/2004
WO   WO-2017039587 A1 *  3/2017  .......... H01L 23/481

OTHER PUBLICATIONS

Yang, Min et al., "Hybrid-Orientation Technology (HOT): Opportunities and Challenges," IEEE Transactions on Electron Devices, May 2006, p. 965-978, vol. 53 No. 5, IEEE, USA.
(Continued)

*Primary Examiner* — Su C Kim
(74) *Attorney, Agent, or Firm* — Rankin, Hill & Clark LLP (57) ABSTRACT

A semiconductor device includes: a silicon substrate having a first plane with a first plane orientation; a silicon oxide layer provided on a first region of the silicon substrate; a first silicon layer provided on the silicon oxide layer, the first silicon layer having a second plane with a second plane orientation different from the first plane orientation; and a wide-bandgap compound semiconductor layer having a hexagonal crystal structure.

11 Claims, 6 Drawing Sheets

(51) Int. Cl.
    *H01L 29/778*    (2006.01)
    *H01L 29/20*    (2006.01)
    *H01L 29/04*    (2006.01)
    *H01L 29/06*    (2006.01)
    *H01L 21/02*    (2006.01)
    *H01L 21/76*    (2006.01)
    *H01L 21/8258*    (2006.01)
    *H01L 27/088*    (2006.01)
    *H01L 21/762*    (2006.01)

(52) U.S. Cl.
    CPC .. *H01L 21/02516* (2013.01); *H01L 21/02529* (2013.01); *H01L 21/76* (2013.01); *H01L 21/76264* (2013.01); *H01L 21/8258* (2013.01); *H01L 27/088* (2013.01); *H01L 29/045* (2013.01); *H01L 29/0649* (2013.01); *H01L 29/1608* (2013.01); *H01L 29/2003* (2013.01); *H01L 29/7786* (2013.01); *H01L 29/7787* (2013.01); *H01L 21/02532* (2013.01); *H01L 21/02609* (2013.01)

(56) References Cited

U.S. PATENT DOCUMENTS

2004/0099871 A1    5/2004   Izumi
2007/0278574 A1*   12/2007   Hsu ................... H01L 21/02381
                                                          257/347
2015/0050753 A1*   2/2015   Srinivasan ........ H01L 21/02538
                                                          438/5

OTHER PUBLICATIONS

Taiwanese Office Action dated Sep. 25, 2019 issued in the corresponding Taiwanese application No. 107130120 and its English translation.

Qimeng Jiang et al., 1.4-kV AlGaN/GaN HEMTs on a GaN-on-SOI Platform, IEEE Electron Device Letters, vol. 34, Issue 3, Mar. 2013, pp. 357-359.; Cited in Taiwanese Office Action.

Ranjan R. Lamichhane et al, A wide bandgap silicon carbide (SiC) gate driver for high-temperature and high-voltage applications, IEEE Proceedings of the 26th International Symposium on Power Semiconductor Devices & IC's, 2014, pp. 414-417.; Cited in Taiwanese Office Action.

* cited by examiner

SEMICONDUCTOR DEVICE AND METHOD FOR MANUFACTURING THE SAME

CROSS-REFERENCE TO RELATED APPLICATION

This application is based upon and claims the benefit of priority from Japanese Patent Applications No. 2017-173834, filed on Sep. 11, 2017, the entire contents of which are incorporated herein by reference.

FIELD OF THE INVENTION

The present invention relates to a semiconductor device and a method for manufacturing the same.

BACKGROUND OF THE INVENTION

In recent years, the application range of power devices using a wide-bandgap compound semiconductor has been rapidly expanded. In many cases, the power devices are combined with devices using silicon (Si) and then used.

Until now, chips using the wide-bandgap compound semiconductor are packaged into one module.

However, in the formation method, it is necessary to individually form each chip. Therefore, the formation method is complicated and there is a limitation in reducing the size of the module. Accordingly, a technique that can provide a compound semiconductor device and a silicon device in one chip is required.

SUMMARY OF THE INVENTION

A semiconductor device according to an aspect of the invention includes: a silicon substrate having a first plane with a first plane orientation; a silicon oxide layer provided on a first region of the silicon substrate; a first silicon layer provided on the silicon oxide layer, the first silicon layer having a second plane with a second plane orientation different from the first plane orientation; and a wide-bandgap compound semiconductor layer having a hexagonal crystal structure.

DETAILED DESCRIPTION OF THE EMBODIMENTS

Hereinafter, embodiments of the invention will be described with reference to the drawings.

In the specification, a "nitride semiconductor" is the general term of a semiconductor including gallium nitride (GaN), aluminum nitride (AlN), indium nitride (InN), and intermediate compositions thereof.

In the specification, in order to show the positional relationship between, for example, components, the upper direction in the drawings is described as an "upper side" and the lower direction in the drawings is described as a "lower side". In the specification, the terms "upper side" and "lower side" do not necessarily indicate the relationship with the direction of gravity.

First Embodiment

A semiconductor device according to this embodiment includes: a silicon substrate having a first plane with a first plane orientation; a silicon oxide layer provided on a first region of the silicon substrate; a first silicon layer provided on the silicon oxide layer, the first silicon layer having a second plane with a second plane orientation different from the first plane orientation; and a wide-bandgap compound semiconductor layer having a hexagonal crystal structure.

The semiconductor device further includes a second silicon layer provided on a second region of the silicon substrate, the second region being different from the first region. The wide-bandgap compound semiconductor layer is provided on the first silicon layer. The first plane orientation is {100} and the second plane orientation is {111}.

A method for manufacturing a semiconductor device 100 according to this embodiment includes: forming a wide-bandgap compound semiconductor layer having a hexagonal crystal structure on a first silicon layer provided on a silicon oxide layer, the first silicon layer having a second plane, a plane orientation of the second plane being {111}, the silicon oxide layer being provided on a first region of a silicon substrate, the silicon substrate having a first plane, a plane orientation of the first plane being {100}; and forming a second silicon layer on a second region of the silicon substrate.

Figure 1:
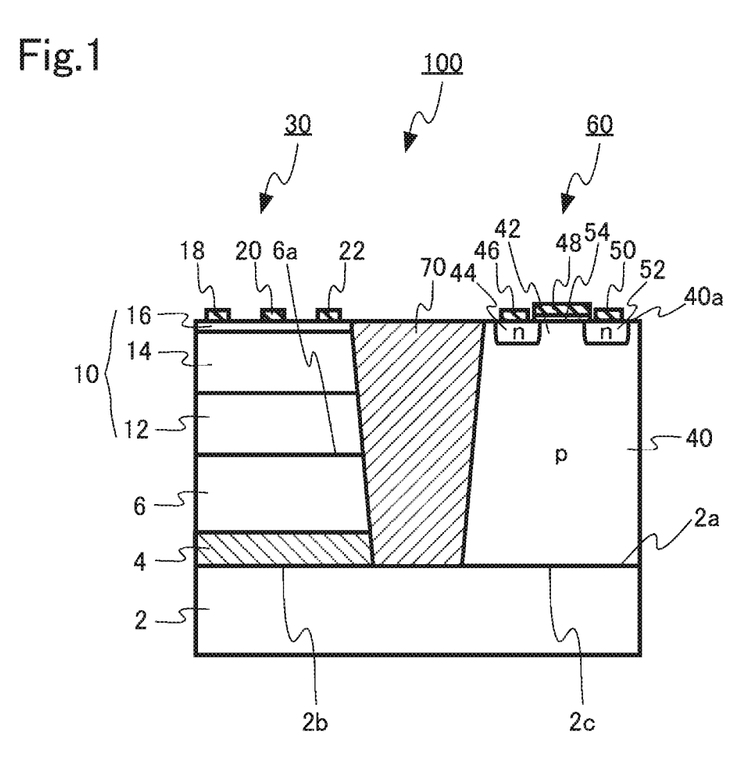
FIG. 1 is a cross-sectional view schematically illustrating a semiconductor device according to a first embodiment.

FIG. 1 is a cross-sectional view schematically illustrating the semiconductor device 100 according to this embodiment.

The plane orientation of a first plane 2a of a silicon substrate 2 is the {100} face. However, the plane orientation may be inclined at an off angle of 10 degrees or less with respect to the {100} face.

Then, a silicon oxide layer 4 is provided on a first region 2b of the first plane 2a of the silicon substrate 2. The silicon oxide layer 4 is a so-called buried oxide (BOX) layer.

A first silicon layer 6 is provided on the silicon oxide layer 4. The first silicon layer 6 is a so-called silicon-on-insulator (SOI) layer. The plane orientation of a second plane 6a of the first silicon layer 6 is the {111} face different from the plane orientation of the first plane 2a. However, the plane orientation may be inclined at an off angle of 10 degrees or less with respect to the {111} face. The silicon substrate 2, the silicon oxide layer 4, and the first silicon layer 6 may be formed by an SOI substrate.

A wide-bandgap compound semiconductor layer 10 is provided on the second plane 6a of the first silicon layer 6. For example, a nitride semiconductor is used as a wide-bandgap compound of the wide-bandgap compound semiconductor layer 10.

The wide-bandgap compound semiconductor layer 10 includes a buffer layer 12, a first nitride semiconductor layer 14 provided on the buffer layer 12, and a second nitride semiconductor layer 16 provided on the first nitride semiconductor layer 14 and has a wider bandgap than the first nitride semiconductor layer 14. A crystal structure of the nitride semiconductor is a hexagonal crystal structure.

The first nitride semiconductor layer 14 is made of, for example, undoped $Al_XGa_{1-X}N$ (0≤X<1). More specifically, for example, the first nitride semiconductor layer 14 is made of undoped GaN. The second nitride semiconductor layer 16 is made of, for example, undoped $Al_YGa_{1-Y}N$ (0<Y≤1, X<Y). More specifically, for example, the second nitride semiconductor layer 16 is made of undoped $Al_{0.2}Ga_{0.8}N$.

The buffer layer 12 has a function of reducing the lattice mismatch between the first silicon layer 6 and the first nitride semiconductor layer 14. The buffer layer 12 has, for example, an aluminum gallium nitride $(Al_WGa_{1-W}N$ (0<W<1) multi-layer structure.

A first source electrode 18, a first gate electrode 20, and a first drain electrode 22 are provided on the second nitride semiconductor layer 16. The first gate electrode 20 is provided between the first source electrode 18 and the first drain electrode 22.

The first source electrode 18, the first gate electrode 20, and the first drain electrode 22 are, for example, metal electrodes. It is preferable that the first source electrode 18 and the first drain electrode 22 come into ohmic contact with the second nitride semiconductor layer 16.

The first nitride semiconductor layer 14, the second nitride semiconductor layer 16, the first source electrode 18, the first gate electrode 20, and the first drain electrode 22 form a normally-on high-voltage high-electron-mobility transistor (HEMT) 30.

In a case in which the resistance value of the first silicon layer 6 is small and the HEMT 30 is operated at a high frequency, the HEMT 30 is dielectrically and inductively coupled to the silicon substrate 2 and loss is likely to occur. In order to prevent the loss, it is preferable that the first silicon layer 6 is undoped and has high resistance.

A p-type second silicon layer 40 is provided on a second region 2c of the silicon substrate 2 which is different from the first region 2b so as to come into contact with the silicon substrate 2. The second silicon layer 40 is formed by, for example, an epitaxial growth method. For example, boron (B) is preferably used as p-type impurities. The plane orientation of a third plane 40a of the second silicon layer 40 is, for example, the {100} face. However, the plane orientation may be inclined at an off angle of 10 degrees or less.

Then, an n-type source region 44 and an n-type drain region 52 are provided on the second silicon layer 40. For example, arsenic (As) and phosphorus (P) are preferably used as n-type impurities. A portion of the second silicon layer 40 between the source region 44 and the drain region 52 becomes a channel region 42.

A second source electrode 46 is provided on the source region 44. A second drain electrode 50 is provided on the drain region 52. A gate insulating film 54 is provided between the second source electrode 46 and the second drain electrode 50 on the channel region 42. A second gate electrode 48 is provided on the gate insulating film 54.

The second source electrode 46 and the second drain electrode 50 are, for example, metal electrodes. The second gate electrode 48 is, for example, a polysilicon electrode. The gate insulating film 54 is made of, for example, silicon oxide.

The source region 44, the channel region 42, the drain region 52, the gate insulating film 54, the second source electrode 46, the second drain electrode 50, and the second gate electrode 48 form an n-type Si-MOSFET 60. The Si-MOSFET 60 is, for example, a low-voltage Si-MOSFET.

An element isolation layer 70 is provided between the second silicon layer 40, and the silicon oxide layer 4, the first silicon layer 6, and the wide-bandgap compound semiconductor layer 10 on the silicon substrate 2. The element isolation layer 70 is made of, for example, con oxide and electrically insulates the HEMT 30 from the Si-MOSFET 60.

Figure 2:
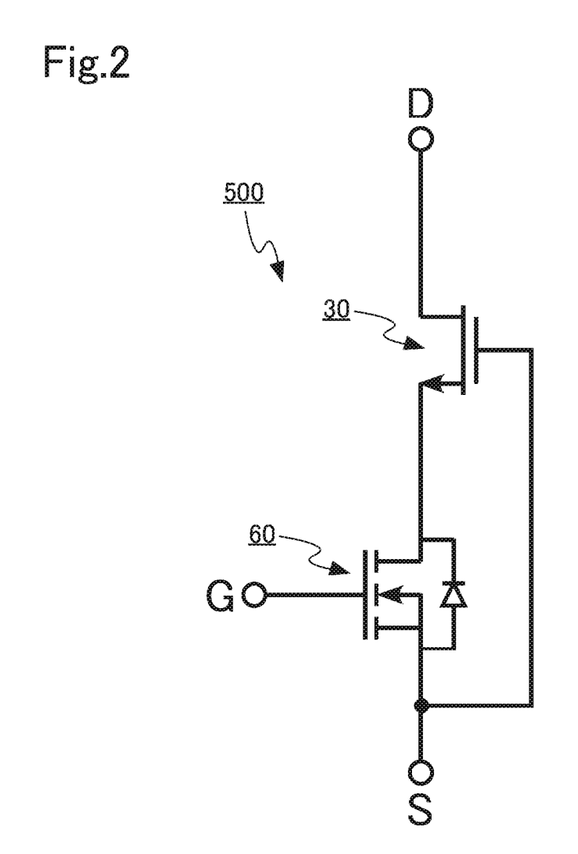
FIG. 2 is a diagram schematically illustrating a circuit according to the first embodiment.

FIG. 2 is a diagram schematically illustrating a circuit 500 according to this embodiment. The circuit 500 shows a cascode connection between the HEMT 30 and the Si-MOSFET 60. Specifically, the gate electrode of the HEMT 30 and the source electrode of the Si-MOSFET 60 are electrically connected to each other and the source electrode of the HEMT 30 and the drain electrode of the Si-MOSFET 60 are electrically connected to each other.

The cascode connection between the HEMT 30 and the Si-MOSFET 60 makes it possible to use the normally-on HEMT 30 as a normally-off transistor.

The Si-MOSFET may be a MOSFET forming a gate driver circuit of the HEMT.

Next, a method for manufacturing the semiconductor device 100 according to this embodiment will be described.

Figure 3A:
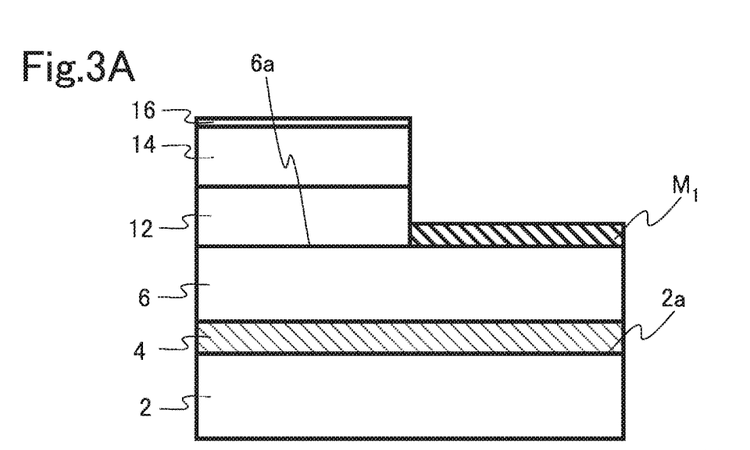
FIGS. 3A to 3C are cross-sectional views schematically illustrating a method for manufacturing the semiconductor device according to the first embodiment.
Figure 3B:
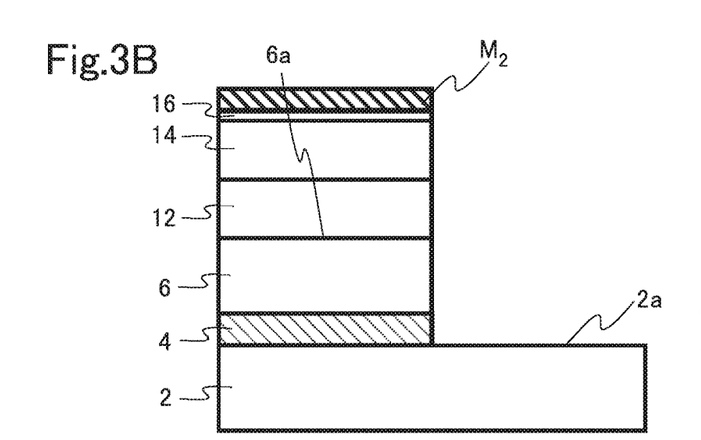
Figure 3C:
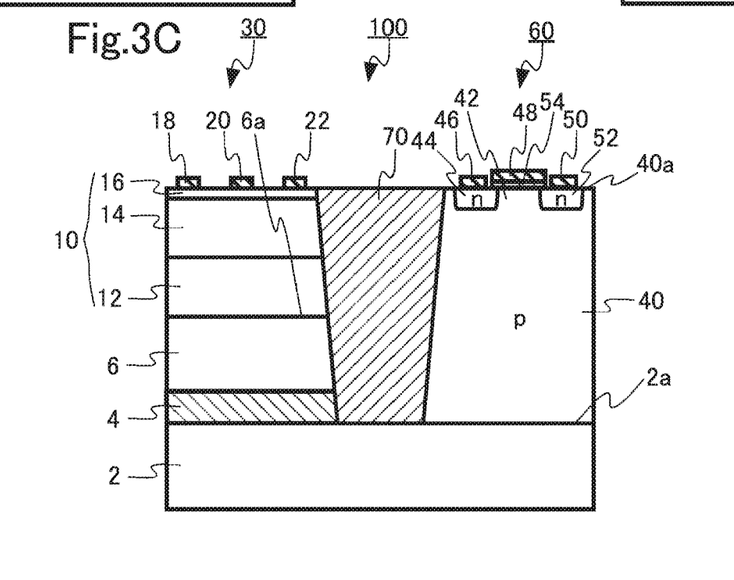

FIGS. 3A to 3C are cross-sectional views schematically illustrating the method for manufacture the semiconductor device according to this embodiment.

First, an SOI substrate including the first silicon layer 6 that has the second plane 6a which is the {111} face and is provided on the silicon oxide layer 4 on the silicon substrate 2 having the first plane 2a which is the {100} face is prepared. The plane orientation of each silicon substrate may be inclined at an off angle of 10 degrees or less.

Then, a mask member $M_1$ is formed on a portion of the first silicon layer 6. Then, the wide-bandgap compound semiconductor layer 10 including the buffer layer 12, the first nitride semiconductor layer 14 provided on the buffer layer 12, and the second nitride semiconductor layer 16 provided on the first nitride semiconductor layer 14 is formed on a portion of the first silicon layer 6, on which the mask member $M_1$ is not formed, by epitaxial growth (FIG. 3A).

Then, a mask member $M_2$ is formed on the second nitride semiconductor layer 16, and a portion of the silicon oxide layer 4 and a portion of the first silicon layer 6 in which the mask member $M_1$ is formed and the mask member $M_1$ are removed (FIG. 3B).

Then, the second silicon layer 40 is formed on the first plane 2a of the silicon substrate 2 by epitaxial growth so as to come into contact with the first plane 2a of the silicon substrate 2.

Then, a trench is formed between the second silicon layer 40, and the silicon oxide layer 4, the first silicon layer 6, and the wide-bandgap compound semiconductor layer 10. Then, the element isolation layer 70 is formed in the formed trench.

Then, the source region 44, the drain region 52, the channel region 42, the second source electrode 46, the second drain electrode 50, the gate insulating film 54, and the second gate electrode 48 are formed on the second silicon layer 40. Then, the first source electrode 18, the first gate electrode 20, and the first drain electrode 22 are formed on the second nitride semiconductor layer 16 to obtain the semiconductor device 100 according to this embodiment (FIG. 3C).

Next, the function and effect of the semiconductor device 100 according to this embodiment will be described.

In general, a device using a wide-bandgap compound semiconductor is combined with other devices, such as a Si-MOSFET, and is operated.

The crystal structure of a nitride semiconductor is hexagonal crystal structure. Therefore, the nitride semiconductor is generally formed on the {111} face of silicon for easy epitaxial growth.

In contrast, it is preferable that the Si-MOSFET be formed on the {100} face of silicon since a PMOS/NMOS mobility balance is good and a high-reliability gate oxide film is obtained.

Therefore, a device using a wide-bandgap compound semiconductor and a device using silicon are manufactured on different substrates and are integrated into one package in a modularization stage.

In the semiconductor device 100 according to this embodiment, the Si-MOSFET 60 is provided on the {100} face 2a of the silicon substrate 2. The HEMT 30 is provided on the {111} face 6a of the first silicon layer 6 which is provided on the silicon oxide layer 4 on the silicon substrate 2. Therefore, a device using a wide-bandgap compound semiconductor and a device using silicon can be provided in one chip.

In the circuit 500 in which the semiconductor device 100 is formed, the HEMT 30 and the Si-MOSFET 60 are cascode-connected. In general, an HEMT using a nitride semiconductor is normally on. Therefore, even in a case in which a gate bias is zero, current is applied to the HEMT. The circuit 500 according to this embodiment makes it possible to provide the circuits in which normally-off HEMTs operate in one chip.

In addition, since the silicon oxide layer 4 is provided between the HEMT 30 and the silicon substrate 2, it is possible to increase the breakdown voltage of the HEMT 30.

In a case in which the resistance value of the silicon substrate 2 is small and the HEMT 30 is operated at a high frequency, the HEMT 30 is dielectrically and inductively coupled to the silicon substrate 2 and loss is likely to occur. However, in a case in which the silicon oxide layer 4 is provided between the HEMT 30 and the silicon substrate 2 as in the semiconductor device 100 according to this embodiment, it is possible to prevent loss caused by dielectric and inductive coupling since the resistance value of the silicon oxide layer 4 is large.

In a case in which the wide-bandgap compound semiconductor layer 10 is provided, a process that maintains the substrate at a high temperature for a longer period than that in the device using silicon is required. For example, in the case of the device using a nitride semiconductor layer, a process for maintaining the substrate at a temperature of about 1000° C. for a few hours is required. However, it is difficult for the device using silicon to withstand such a high temperatures.

In the method for manufacture the semiconductor device 100 according to this embodiment, after the wide-bandgap compound semiconductor layer 10 is formed, the Si-MOSFET 60 is formed. Therefore, it is possible to manufacture the semiconductor device 100 without applying the high temperature to the device using silicon.

According to the semiconductor device of this embodiment, it is possible to provide a semiconductor device that can include a wide-bandgap compound semiconductor device and a silicon device.

Second Embodiment

A semiconductor device according to this embodiment differs from the semiconductor device according to the first embodiment in that the wide-bandgap compound semiconductor layer is provided on the second region of the silicon substrate, the first plane orientation is the {111} face, and the second plane orientation is the {100} face. The plane orientation of each silicon substrate may be inclined at an off angle of 10 degrees or less. Here, the description of the same content as that in the first embodiment will not be repeated.

Figure 4:
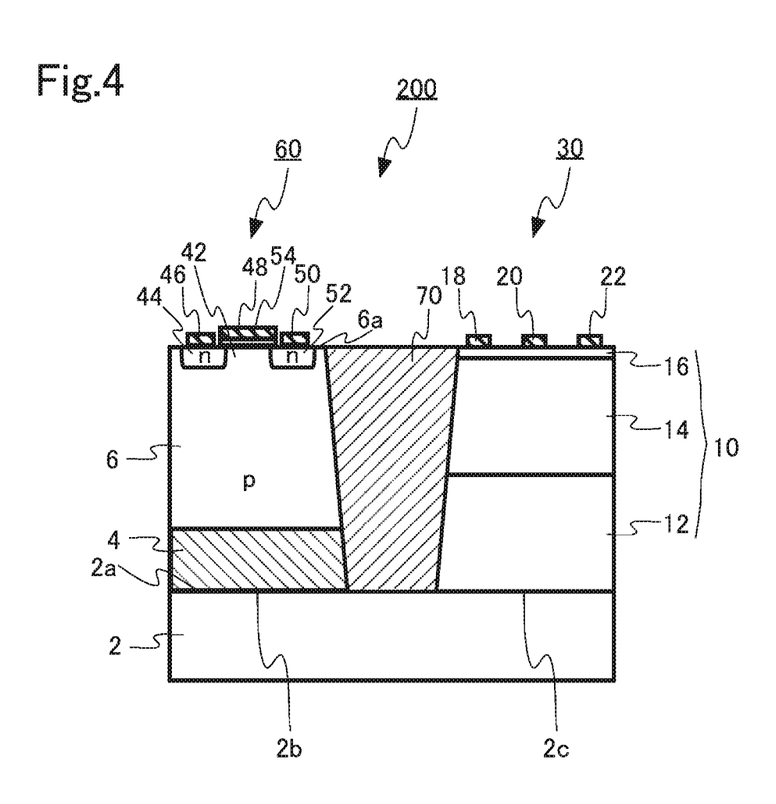
FIG. 4 is a cross-sectional view schematically illustrating a semiconductor device according to a second embodiment.

FIG. 4 is a cross-sectional view schematically illustrating a semiconductor device 200 according to this embodiment.

A silicon substrate 2 has a first plane 2a which is the {111} face. A silicon oxide layer 4 is provided on the silicon substrate 2.

A first silicon layer 6 is provided on the silicon oxide layer 4. The first silicon layer 6 has a second plane 6a which is the {100} face. A Si-MOSFET 60 is provided on the first silicon layer 6.

In addition, a wide-bandgap compound semiconductor layer 10 is provided on a second region 2c of the silicon substrate 2 so as to come into contact with the silicon substrate 2. Then, an HEMT 30 is provided on the wide-bandgap compound semiconductor layer 10.

Figure 5A:
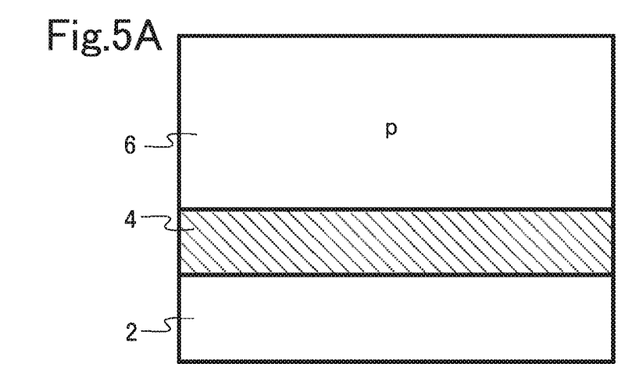
FIGS. 5A to 5C are cross-sectional views schematically illustrating a method for manufacturing the semiconductor device according to the second embodiment.
Figure 5B:
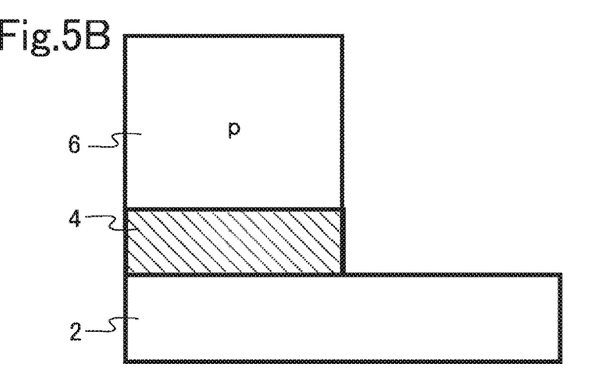
Figure 5C:
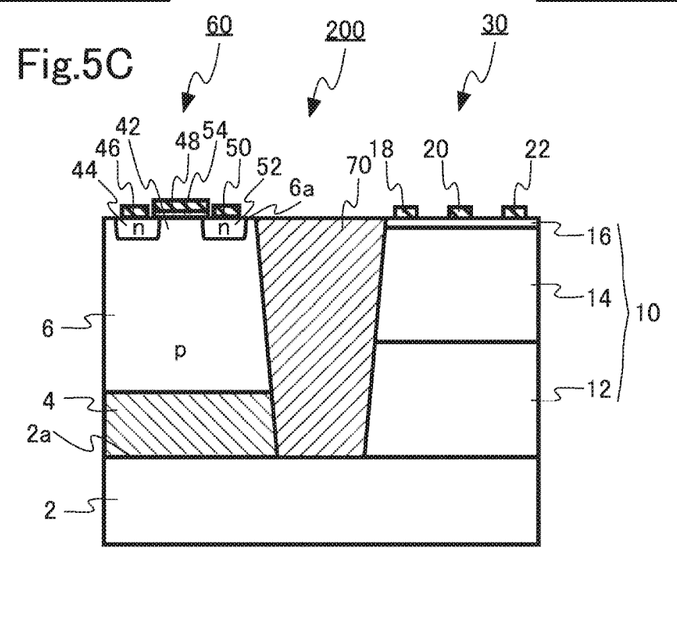

FIGS. 5A to 5C are cross-sectional views schematically illustrating a method for manufacturing the semiconductor device according to this embodiment.

The method for manufacturing the semiconductor device 200 according to this embodiment includes: removing a portion of a silicon oxide layer and a portion of a first silicon layer such that a portion of a silicon substrate is exposed, the first silicon layer being provided on the silicon oxide layer, the first silicon layer having a second plane, the second plane being a {100} face, the silicon oxide layer being provided on the silicon substrate, the silicon substrate having a first plane, the first plane being a {111} face; and forming a wide-bandgap compound semiconductor layer having a hexagonal crystal structure on the exposed portion of the silicon substrate.

First, an SOI substrate including the first silicon layer 6 that has the second plane which is the {100} face and is provided on the silicon oxide layer 4 on the silicon substrate 2 having the first plane which is the {111} face is prepared (FIG. 5A).

Then, a portion of the silicon oxide layer 4 and a portion of the first silicon layer 6 are removed (FIG. 5B).

Then, a buffer layer 12, a first nitride semiconductor layer 14, and a second nitride semiconductor layer 16 are sequentially formed on the exposed first plane 2a of the silicon substrate 2.

Then, a trench is formed between the buffer layer 12, the first nitride semiconductor layer 14, and the second nitride semiconductor layer 16, and the silicon oxide layer 4 and the first silicon layer 6. Then, an element isolation layer 70 is formed in the formed trench.

Then, a source region 44, a drain region 52, a channel region 42, a second source electrode 46, a second drain electrode 50, a gate insulating film 54, and a second gate electrode 48 are formed on the first silicon layer 6. Then, a first source electrode 18, a first gate electrode 20, and a first drain electrode 22 are formed on the second nitride semiconductor layer 16 to obtain the semiconductor device 200 according to this embodiment (FIG. 5C).

In the semiconductor device 200 according to this embodiment, it is possible to thicken the first nitride semiconductor layer 14 and the second nitride semiconductor layer 16. Therefore, it is possible to increase the breakdown voltage of the HEFT 30.

In addition, the semiconductor device 200 differs from the semiconductor device 100 according to the first embodiment in that it does not include the second silicon layer 40. Therefore, it is possible to reduce the number of epitaxial growth processes by one.

According to the semiconductor device of this embodiment, it is possible to provide a semiconductor device that can include a wide-bandgap compound semiconductor device and a silicon device.

Third Embodiment

A semiconductor device 300 according to this embodiment differs from the semiconductor devices according to the first and second embodiments in that silicon carbide (SiC) is used as the wide-bandgap compound semiconductor layer 10. Here, the description of the same content as that in the first embodiment will not be repeated.

Figure 6:
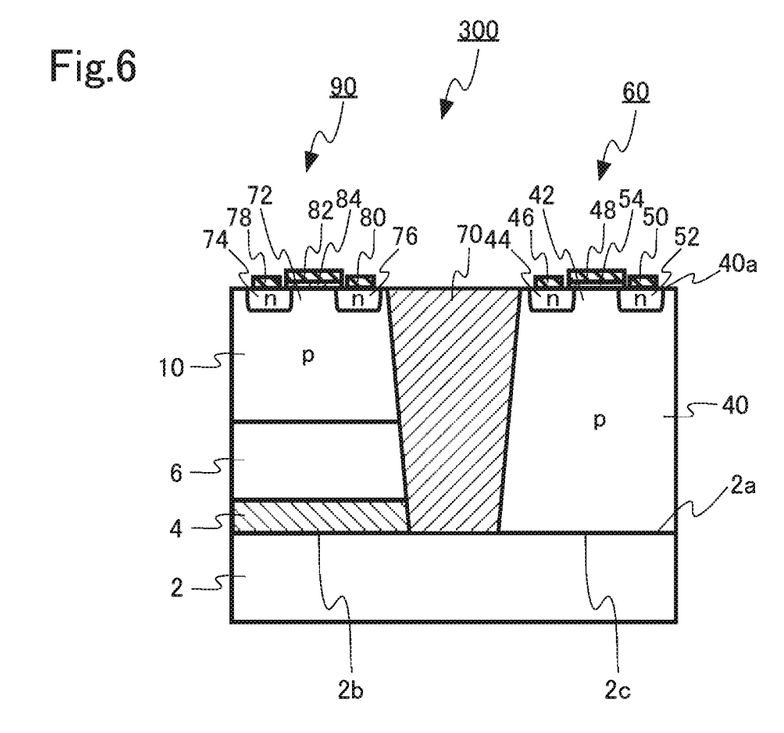
FIG. 6 is a cross-sectional view schematically illustrating a semiconductor device according to a third embodiment.

FIG. 6 is a view schematically illustrating the semiconductor device 300 according to this embodiment.

A wide-bandgap compound semiconductor layer 10 of the semiconductor device 300 is a p-type 4H—SiC or 6H—SiC carbide layer. The crystal structure of 4H—SiC and 6H—SiC is a hexagonal crystal structure.

The semiconductor device 300 includes a SiC-MOSFET 90. An n-type source region 74 and an n-type drain region 76 are provided in the wide-bandgap compound semiconductor layer 10. A channel region 72 is provided between the source region 74 and the drain region 76.

A source electrode 78 is provided on the source region 74 and a drain electrode 80 is provided on the drain region 76.

A gate insulating film 84 is provided on the channel region 72. Then, a gate electrode 82 is provided on the gate insulating film 84.

According to the semiconductor device of this embodiment, it is possible to provide a semiconductor device that can include a wide-bandgap compound semiconductor device and a silicon device.

The embodiments of the invention have been described with reference to examples. These embodiments have been presented by way of example only and are not intended to limit the scope of the inventions. In addition, the components of each embodiment may be appropriately combined with each other.

In the embodiments, for example, portions that are not directly required for the description of the invention, such as device configurations and manufacturing methods, are not described. However, for example, necessary device configurations and necessary manufacturing methods may be appropriately selected and used. In addition, all inspection methods which include the elements according to the invention and whose design can be appropriately changed by those skilled in the art are included in the scope of the invention. The scope of the invention is defined by the scope of the claims and the scope of their equivalents.

What is claimed is:

1. A semiconductor device comprising:
   a silicon substrate having a first plane with a first plane orientation;
   a silicon oxide layer provided on a first region of the silicon substrate;
   a first silicon layer provided on the silicon oxide layer, the first silicon layer having a second plane with a second plane orientation different from the first plane orientation;
   a wide-bandgap compound semiconductor layer having a hexagonal crystal structure; and
   a second silicon layer provided on a second region of the silicon substrate, the second region being different from the first region,
   wherein the wide-bandgap compound semiconductor layer is provided on the first silicon layer,
   the first plane orientation is {100},
   the second plane orientation is {111} and,
   the first silicon layer is undoped.

2. The semiconductor device according to claim 1, wherein the wide-bandgap compound semiconductor layer includes a nitride semiconductor.

3. The semiconductor device according to claim 1, wherein the wide-bandgap compound semiconductor layer includes silicon carbide.

4. The semiconductor device according to claim 1, further comprising:
   a first source electrode, a first drain electrode and a first gate electrode provided on the wide-bandgap compound semiconductor layer,
   wherein the first gate electrode is provided between the first source electrode and the first drain electrode.

5. The semiconductor device according to claim 1, further comprising:
   an element isolation layer provided between the second silicon layer, and the silicon oxide layer, the first silicon layer, and the wide-bandgap compound semiconductor layer.

6. The semiconductor device according to claim 1, further comprising:
   an n-type source region provided on the second silicon layer;
   an n-type drain region provided on the second silicon layer;
   a second source electrode provided on the source region;
   a second drain electrode provided on the drain region;
   a gate insulating film provided between the second source electrode and the second drain electrode; and
   a second gate electrode provided on the gate insulating film,
   wherein the second silicon layer is a p type.

7. The semiconductor device according to claim 1, further comprising:
   a first source electrode, a first drain electrode and a first gate electrode provided on the wide-bandgap compound semiconductor layer;
   an n-type source region provided on the second silicon layer;
   an n-type drain region provided on the second silicon layer;
   a second source electrode provided on the source region;
   a second drain electrode provided on the drain region;
   a gate insulating film provided between the second source electrode and the second drain electrode; and
   a second gate electrode provided on the gate insulating film,
   wherein the second silicon layer is a p type,
   the first gate electrode is provided between the first source electrode and the first drain electrode,
   the first gate electrode is electrically connected to the second source electrode, and
   the first source electrode is electrically connected to the second drain electrode.

8. A semiconductor device comprising:
   a silicon substrate having a first plane with a first plane orientation;
   a silicon oxide layer provided on a first region of the silicon substrate;

a first silicon layer provided on the silicon oxide layer, the first silicon layer having a second plane with a second plane orientation different from the first plane orientation; and a wide-bandgap compound semiconductor layer having a hexagonal crystal structure;

wherein the wide-bandgap compound semiconductor layer is provided on a second region of the silicon substrate, the second region being different from the first region, the first plane orientation is {111}, the second plane orientation is {100}, and the second region of the silicon substrate is undoped.

9. The semiconductor device according to claim 8, further comprising:

a first source electrode, a first drain electrode and a first gate electrode provided on the wide-bandgap compound semiconductor layer;

an n-type source region provided on the first silicon layer;

an n-type drain region provided on the first silicon layer;

a second source electrode provided on the source region;

a second drain electrode provided on the drain region;

a gate insulating film provided between the second source electrode and the second drain electrode; and a second gate electrode provided on the gate insulating film, wherein the second silicon layer is a p type, the first gate electrode is provided between the first source electrode and the first drain electrode, the first gate electrode is electrically connected to the second source electrode, and the first source electrode is electrically connected to the second drain electrode.

10. The semiconductor device according to claim 8, further comprising:

an element isolation layer provided between the wide-bandgap compound semiconductor layer, and the silicon oxide layer and the first silicon layer.

11. The semiconductor device according to claim 8, further comprising:

an n-type source region provided on the first silicon layer;

an n-type drain region provided on the first silicon layer;

a third source electrode provided on the source region;

a third drain electrode provided on the drain region;

a gate insulating film provided between the third source electrode and the third drain electrode; and a third gate electrode provided on the gate insulating film, wherein the first silicon layer is a p type.

\* \* \* \* \*